(12) United States Patent
Lopez et al.

(10) Patent No.: US 11,302,848 B2
(45) Date of Patent: Apr. 12, 2022

(54) BROADBAND MIRROR

(71) Applicant: Lumileds LLC, San Jose, CA (US)

(72) Inventors: Toni Lopez, Aachen (DE); Fahong Jin, San Jose, CA (US)

(73) Assignee: LUMILEDS LLC, San Jose, CA (US)

(*) Notice: Subject to any disclaimer, the term of this patent is extended or adjusted under 35 U.S.C. 154(b) by 136 days.

(21) Appl. No.: 16/093,560

(22) PCT Filed: Apr. 5, 2017

(86) PCT No.: PCT/EP2017/058098
§ 371 (c)(1),
(2) Date: Oct. 12, 2018

(87) PCT Pub. No.: WO2017/178299
PCT Pub. Date: Oct. 19, 2017

(65) Prior Publication Data
US 2019/0131498 A1 May 2, 2019

(30) Foreign Application Priority Data
Apr. 15, 2016 (EP) .................................. 16165481

(51) Int. Cl.
*H01L 33/46* (2010.01)
*G02B 5/08* (2006.01)
(Continued)

(52) U.S. Cl.
CPC ............ *H01L 33/46* (2013.01); *G02B 5/0808* (2013.01); *H01L 33/58* (2013.01); *G02B 5/28* (2013.01); *H01L 2933/0025* (2013.01)

(58) Field of Classification Search
None
See application file for complete search history.

(56) References Cited

U.S. PATENT DOCUMENTS

| 5,115,442 A | 5/1992 | Lee et al. |
| 5,726,805 A | 3/1998 | Kaushik et al. |

(Continued)

FOREIGN PATENT DOCUMENTS

| CN | 1858918 A | 11/2006 |
| CN | 103698826 A | 4/2014 |

(Continued)

OTHER PUBLICATIONS

International Preliminary Report on Patentability dated Oct. 16, 2018 for PCT International Application No. PCT/EP2017/058098.
(Continued)

*Primary Examiner* — Shaun M Campbell
*Assistant Examiner* — Aneta B Cieslewicz
(74) *Attorney, Agent, or Firm* — Volpe Koenig

(57) ABSTRACT

The invention describes a broadband mirror comprising an outer surface layer; and a dielectric layer stack arranged underneath the outer surface layer; characterized in that the dielectric layer stack comprises at least one patterned surface at an interface between adjacent dielectric layers of the dielectric layer stack. The invention further describes a light-emitting diode. The invention also describes a method of manufacturing a broadband mirror, which method comprises the steps of providing an outer surface layer and applying a plurality of dielectric layers to build a dielectric layer stack underneath the outer surface layer, characterized by the step of patterning the surface of at least one dielectric layer before applying a subsequent dielectric layer to the patterned surface.

16 Claims, 3 Drawing Sheets

(51) Int. Cl.
*H01L 33/58* (2010.01)
*G02B 5/28* (2006.01)

(56) References Cited

U.S. PATENT DOCUMENTS

| | | | |
|---|---|---|---|
| 7,136,217 B2 | 11/2006 | Kawakami et al. | |
| 9,494,742 B2 | 11/2016 | Nishiwaki | |
| 2003/0222225 A1 | 12/2003 | Shiraishi | |
| 2004/0047039 A1* | 3/2004 | Wang | G02B 5/1809 |
| | | | 359/485.02 |
| 2005/0156178 A1* | 7/2005 | Takeda | F21S 41/155 |
| | | | 257/79 |
| 2010/0315713 A1 | 12/2010 | Walter et al. | |
| 2011/0164308 A1* | 7/2011 | Arsenault | G02F 1/0147 |
| | | | 359/322 |
| 2011/0180823 A1 | 7/2011 | Usami | |
| 2012/0043522 A1 | 2/2012 | Yan et al. | |
| 2012/0299040 A1* | 11/2012 | Kim | H01L 33/20 |
| | | | 257/98 |
| 2014/0021505 A1* | 1/2014 | Huang | H01L 33/02 |
| | | | 257/98 |
| 2014/0034986 A1* | 2/2014 | Bradley, Jr. | H01L 33/60 |
| | | | 257/98 |
| 2014/0209949 A1 | 7/2014 | Chuang et al. | |
| 2015/0171370 A1* | 6/2015 | Ehrensperger | H01L 51/5268 |
| | | | 257/40 |
| 2015/0228931 A1* | 8/2015 | Lamansky | H01L 51/5275 |
| | | | 257/40 |
| 2017/0207421 A1* | 7/2017 | Matsuzaki | H01L 51/0096 |

FOREIGN PATENT DOCUMENTS

| | | |
|---|---|---|
| EP | 1675164 A1 | 6/2006 |
| JP | 2004-054197 A | 2/2004 |
| JP | 2004-325946 A | 11/2004 |
| JP | 2008-083599 A | 4/2008 |
| WO | 2012/101393 A1 | 8/2012 |
| WO | 2015/023536 A1 | 2/2015 |
| WO | 2015/155357 A1 | 10/2015 |

OTHER PUBLICATIONS

International Search Report dated Oct. 19, 2017 for PCT International Application No. PCT/EP2017/058098.

* cited by examiner

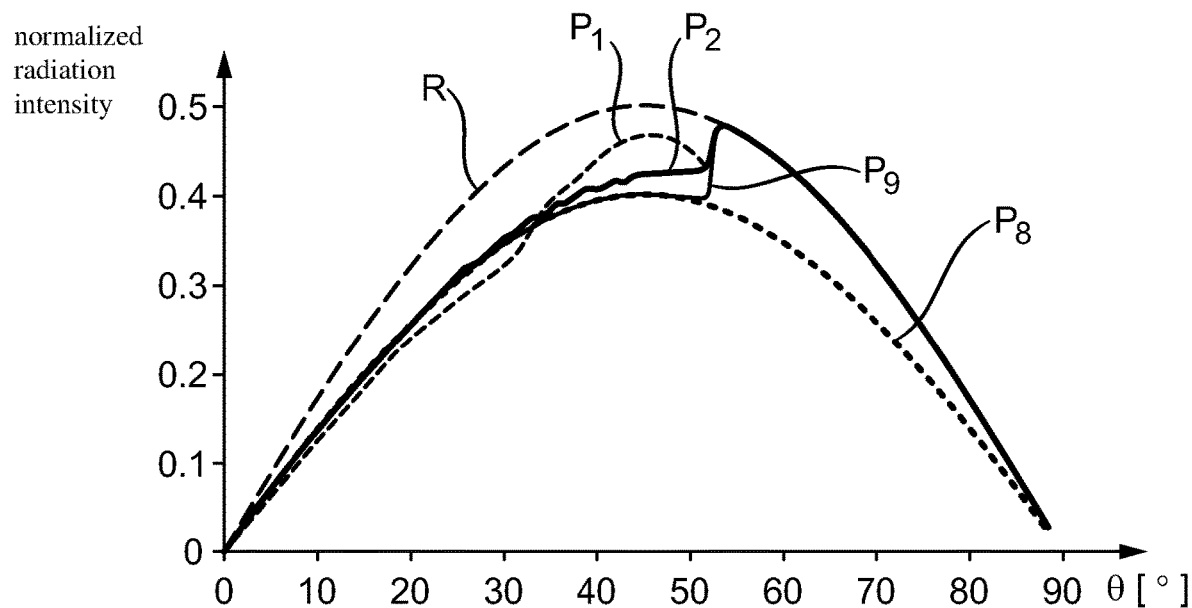
FIG. 7
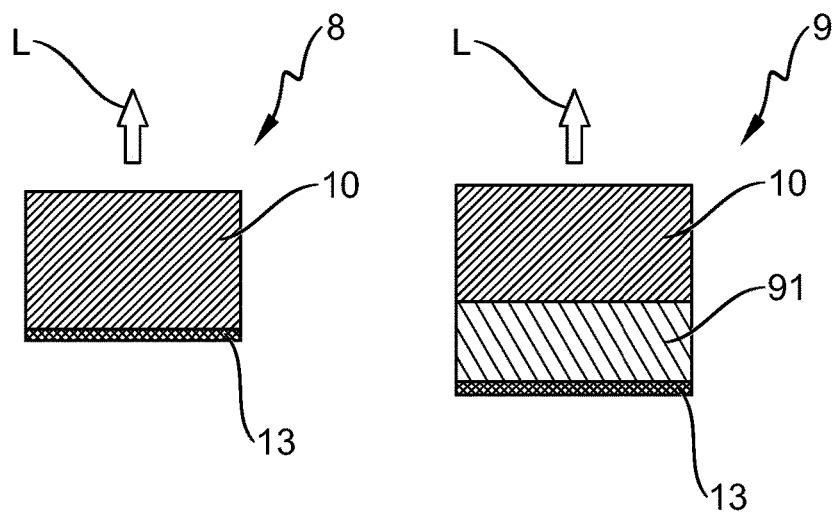
FIG. 8
(prior art)
FIG. 9
(prior art)

BROADBAND MIRROR

FIELD OF THE INVENTION

The invention describes a broadband mirror, a light-emitting diode, and a method of manufacturing a broadband mirror.

BACKGROUND OF THE INVENTION

Broadband mirrors are used to maximize the efficiency of optical systems and maintain colour integrity. For example, increasing the reflectivity of mirrors used in light engines and projectors is directly related to an improvement or increase in brightness. A distributed Bragg reflector (DBR) is one kind of semiconductor mirror, comprising many layers of precisely deposited material. However, a disadvantage of a DBR is its wavelength-dependency, since a specific DBR can only reflect light within certain band of wavelengths. Light outside this band will not be reflected by the multilayer stack. Furthermore, the reflectivity response of a DBR may depend on the angle of incidence of the light. Therefore, a DBR may only effectively reflect light within a limited range of wavelengths and angles of incidence.

As an alternative to a DBR, a prior art metal mirror can be arranged as a reflective backing to ensure that as much light as possible leaves the die through the light emission face. The reflective backing and the light-emitting surface are generally parallel planes on opposite sides of the composite die. The reflective backing may also effectively act to pass heat through the rear of the device as well as inject current into the pn-junction (metal-semiconductor contact). A reflective backing is generally made of some suitable metal such as silver, aluminium or gold. However, it is impossible to achieve 100% reflectivity, and a metal reflective backing layer will therefore absorb some percentage of the light that reaches it instead of returning it to the emission face of the die. A further disadvantage of the reflective metal layer is its temperature dependence, since care must be taken to ensure reliable operation of the device within a safe temperature range. However, high temperatures arising at a p-n diode junction in such a composite die may cause problems for a metal reflective backing. A metal that is a good optical reflector for an LED may however cause reliability problems when the LED operates at high temperatures. For this reason, some prior art LEDs have been constructed to use a less reflective metal for the reflective backing, and to incorporate an additional dielectric layer in an attempt to compensate for the poorly reflective metal. Even so, the net reflectance of such a composite die may not be sufficient for some applications.

Therefore, it is an object of the invention to provide an improved mirror that overcomes the problems described above.

SUMMARY OF THE INVENTION

The object of the invention is achieved by the broadband mirror according to claim 1; by the light-emitting diode of claim 10; and by the method of claim 11 of manufacturing a broadband mirror.

According to the invention, the broadband mirror comprises an outer surface layer and a dielectric layer stack—an alternating arrangement of low-index layers and high-index layers—applied underneath the outer surface layer, characterized in that the dielectric layer stack comprises at least one patterned surface and at least one non-patterned surface, wherein a patterned surface is formed on one side of a high-index layer at the interface between the high-index layer and a first adjacent low-index layer, and a non-patterned surface is formed on the other side of the high-index layer at the interface between the high-index layer and a second adjacent low-index layer. In the context of the invention, a dielectric layer is to be understood as a planar layer of translucent dielectric material used in the manufacture of a semiconductor die. The dielectric layer stack may also be referred to as a planar layer stack or a multilayer thin film stack.

An advantage of the inventive broadband mirror is that a significant improvement in reflectivity is achieved by integrating roughened dielectric layers in the layer stack. Depending on the construction of the inventive broadband mirror, i.e. on the number of layers, the materials used etc., the improvement in reflectivity can be observed over a wide range of angles of incidence and a wide range of wavelengths. The inventive broadband mirror effectively increases the incident light reflection through the inclusion of roughened or patterned interfaces between two dielectric layers of different refractive index. A further advantage of the inventive broadband mirror is that the patterned interface causes scattering in the light-emitting layer. This is a beneficial effect since scattering is favourable to light outcoupling from the device.

According to the invention, the light-emitting diode is a composite die and comprises such a broadband mirror. The inventive light-emitting diode is characterised by a favourably high light output, since essentially all of the light generated at the diode's p-n junction can leave the diode at the light-emitting surface. This contrast favourably with comparable prior art LED dies, for which a significant fraction of the light is absorbed by the reflective metal layer.

According to the invention, the method of manufacturing a broadband mirror comprises the steps of providing an outer light-emitting surface layer and applying an alternating arrangement of low-index layers and high-index layers to build a dielectric layer stack underneath the outer surface layer, characterized by the step of patterning the surface of at least one dielectric layer to achieve at least one patterned surface on one side of a high-index layer at an interface between the high-index layer and a first adjacent low-index layer, and at least one non-patterned surface on the other side of the high-index layer at the interface between the high-index layer and a second adjacent low-index layer.

An advantage of the inventive method is that relatively little effort is needed to achieve a broadband mirror with favourable performance characteristics. Conventional techniques known from semiconductor manufacture can be used in the steps of applying the dielectric layers and patterning. A device constructed to incorporate the inventive broadband mirror can therefore be realised at little additional cost.

The dependent claims and the following description disclose particularly advantageous embodiments and features of the invention. Features of the embodiments may be combined as appropriate. Features described in the context of one claim category can apply equally to another claim category.

In the following, the expressions "low refractive index material" and "low-index" may be used interchangeably. A "low-index layer" is therefore to be understood as a layer comprising a low refractive index material. Similarly, the expressions "high refractive index material" and "high-index" may be used interchangeably. The terms "layer" and "dielectric layer" are synonymous.

Preferably, the outer surface layer—which will be the light-emitting surface of the broadband mirror—comprises a high-index layer of a suitable material. For example, to achieve a blue/green LED, the outer surface layer preferably comprises a layer of gallium nitride (GaN).

To construct the inventive broadband mirror, successive dielectric layers can be applied underneath an upper or outer layer that will later serve as the emission face of the broadband mirror. Preferably, a dielectric layer has a thickness in the range of 500 nm to 2 µm. Successive layers can be applied using any suitable technique, for example by vapour deposition. Preferably, dielectric layers of the planar layer stack are built up in an alternating arrangement of low-index layers and high-index layers. A suitable material for the high-index layer may be silicon nitride ($Si_3N_4$), while a suitable material for the low-index layer may be silicon dioxide ($SiO_2$). Preferably, any high-index layer is arranged between low-index layers in a sandwich fashion.

As will be evident to the skilled person, different materials may be chosen for the layers, since the colour of the light emitted at the outer surface of the broadband mirror will depend to a large extent on the layer materials used and how they are doped.

The invention is based on the insight that a patterned or roughened dielectric layer incorporated in the planar layer stack can significantly improve the reflectance of the planar layer stack. The increase in reflectance can be explained by a combination of effects governed by the Fresnel equations, i.e. an increase in reflection and a corresponding decrease in transmission caused by an interface between a high-index layer and a low-index layer, an increase in internal reflection caused by the roughened surface of a dielectric layer, etc.

Surprisingly, it has been observed that the reflectance of a planar layer stack is significantly increased by a patterned interface between dielectric layers with different refractive indices. Therefore, one preferred embodiment of the inventive method involves applying at least one low-index layer to the outer surface layer, applying a high-index layer—such as a silicon nitride layer—to that low-index layer, patterning the high-index layer to roughen the lower surface, and applying a further low-index layer to the roughened surface of the high-index layer. In this way, a patterned interface is formed between two dielectric layers that have different refractive indices. The layer deposition process can be terminated at this stage by applying a reflective metal layer to the final low-index layer. The "roughened interface" within the planar layer stack acts to decrease the reflectance of the broadband mirror and to increase its reflectivity, since it effectively returns a larger fraction of the photons in the direction of the light-emitting surface, and only passes a smaller fraction of the photons towards the reflective backing, which in turn will return most of these back towards the light-emitting surface.

In a preferred embodiment of the invention, the layer deposition process described above is repeated at least one more time to achieve a layer stack with two or more such "roughened interfaces". The combined effect of several such "roughened interfaces" is to significantly increase the overall reflectance of the broadband mirror. Each "roughened interface" makes a contribution to the increase in reflectivity of the broadband mirror.

The roughened surface of a dielectric layer can be formed in any suitable manner. For example, one or more of the techniques of photo-electrochemical (PEC) etching, micro-machining, photolithography, nanoimprint lithography etc. may be implemented to achieve the desired surface structure or topology. For example, the chosen technique can be used to form a random pattern or a regular pattern such as a corrugated or ridged structure on the previously deposited dielectric layer. The pattern and pattern density can be chosen to achieve the desired reflectance at the interface between the patterned dielectric layer and the subsequent dielectric layer. For example, pattern features preferably have sizes in the range of 100 nm-2 µm.

A favourably high reflectivity of the inventive broadband mirror can be achieved with only three dielectric layers, namely a low-index layer, a high-index layer with a patterned surface, and a further low-index layer arranged between the light emitting surface and a reflective backing. The reflectivity of the inventive broadband mirror can be further improved by increasing the number of patterned layer interfaces. Preferably, the number of roughened low-index/high-index interfaces arranged in the planar layer stack of the inventive broadband mirror is chosen to obviate or preclude the use of a reflective backing layer. In a preferred embodiment of the invention, therefore, the broadband mirror comprises up to five patterned layer interfaces, distributed in the alternating arrangement of low-index and high-index layers as described above. Such a construction can achieve a very favourable reflectivity, exceeding the reflectivity of known mirrors by several percent.

In contrast with a DBR, which requires many tens of dielectric layers in order to achieve a desired reflectivity, the dielectric layer stack of the inventive broadband mirror preferably comprises at most fifteen dielectric layers, most preferably at most three dielectric layers to achieve a comparable reflectivity. Furthermore, the reflectivity of the inventive broadband mirror is independent of wavelength, unlike a DBR, which is inherently wavelength-dependent.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWINGS

FIG. 7 shows graphs of normalized radiation intensity;
FIG. 8 shows an embodiment of a prior art mirror;
FIG. 9 shows a further embodiment of a prior art mirror.
In the drawings, like numbers refer to like objects throughout. Objects in the diagrams are not necessarily drawn to scale.

DETAILED DESCRIPTION OF THE EMBODIMENTS

Figure 1:
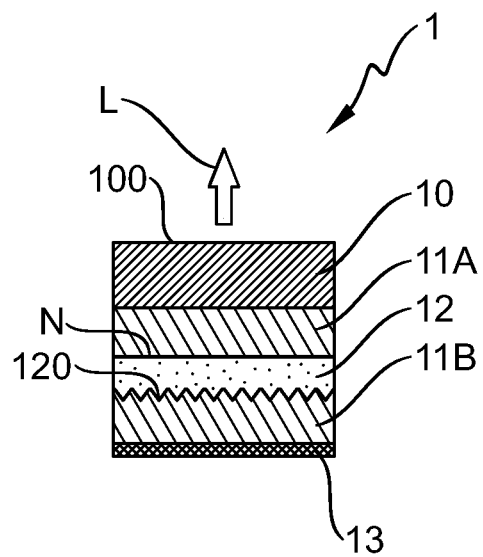
FIG. 1 shows a first embodiment of the broadband mirror according to the invention.

FIG. 1 shows a first embodiment of the broadband mirror 1 according to the invention (in this and the following diagrams, composite die multilayer stacks are shown with exaggerated proportions; the height of a composite die is generally in the range of 5 µm to 15 µm). In this exemplary embodiment, the broadband mirror 1 is constructed as a composite die comprising a stack of four planar layers 10, 11A, 12, 11B and a reflective backing 13. Layers 11A, 12, 11B of suitable material are deposited one after each other, and the final layer 11B is terminated by a reflective backing 13. The planar layers 11A, 12, 11B can be built up in the usual manner, by vapour deposition or any other suitable technique, starting with an uppermost layer 10 and working "downwards", applying a first low-index layer 11A, a high index layer 12, and a second low-index layer 11B Using the inventive method, the high-index layer 12 is applied to the non-patterned surface N of the first adjacent low-index layer 11A. The surface of the high-index layer 12 is roughened before depositing the next or second low-index layer 11B. For the sake of simplicity, the roughened pattern 120 is indicated as a zig-zag line. The pattern size may be in the region of a few nanometers to a few micrometers. The pattern size and the layer properties may be inter-related, for example a suitable pattern size may depend on the thickness of the high-index layer 12, as well as on the index of refraction of the high-index layer 12 and on the index of refraction of the adjacent low-index layer 11B.

The outer surface 100 of the uppermost layer 10 is the light emission face 100. To act as a blue or green LED, the outermost layer 10 comprises a high-index material such as gallium nitride (GaN), and the low-index layers 11A, 11B comprise a low-index material such as (SiO$_2$). Electrical contacts (not shown) are provided in the usual manner. Light is generated at the p-n junction between the outermost layer 10 and the adjoining layer 11A. Since the photons initially travel in essentially all directions, the purpose of the reflective backing 13 is to redirect photons back in the direction of the emission face 100. However, since there is no perfect reflector material, some fraction of the photons reaching the reflective backing 13 will be absorbed. This undesirable effect is counteracted by the structure of the inventive broadband mirror 1, since the presence of a high-index layer 12 with a patterned or roughened surface 120 at a low-index/high-index boundary affects the trajectories of the photons by essentially trapping a quantity of the photons in the high-index patterned layer 12 and sending them back in the direction of the light emission face 100, instead of allowing them to travel in the direction of the reflective backing 13. Effectively, less photons will succeed in reaching the reflective backing 13, and a correspondingly smaller fraction will be lost owing to absorption by the reflective backing. In this way, the high-index patterned layer 12 with its roughened surface 120 increases the light output L of the inventive broadband mirror 1.

Figure 2:
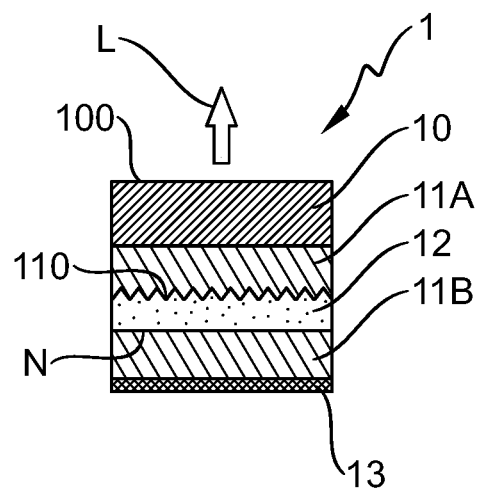
FIG. 2 shows a second embodiment of the broadband mirror according to the invention.

FIG. 2 shows a second embodiment of the broadband mirror 1 according to the invention. Here also, the broadband mirror 1 is constructed as a stack of four planar layers 10, 11A, 12, 11B and a reflective backing 13. In this embodiment, the surface of the first low-index layer 11A is patterned or roughened before depositing the high-index layer 12. A second low-index layer 11B is applied to the non-patterned surface N of the high-index layer 12. The patterned surface 110 of the first high-index layer 12, in conjunction with the low-index/high-index boundary, also acts to prevent photons from passing in the direction of the reflective backing 13, and effectively re-directs them towards the light emission face 100 as described above.

Figure 3:
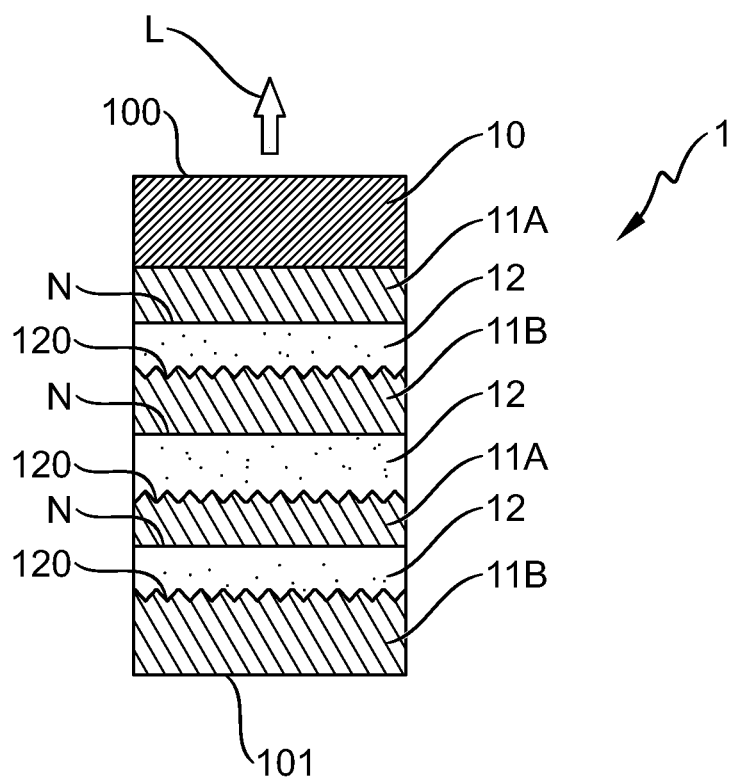
FIG. 3 shows a third embodiment of the broadband mirror according to the invention.

FIG. 3 shows a third embodiment of the broadband mirror 1 according to the invention. In this embodiment, the broadband mirror 1 is constructed as a stack of eight planar layers 10, 11A, 12, 11B. Three high-index layers 12 are sandwiched between low-index layers 11A, 11B. Each high-index layer 12 is applied to the non-patterned surface N of the preceding low-index layer 11A, 11B. The surface of each high-index layer 12 is roughened before depositing the subsequent low-index layer 11A, 11B. Since each high-index layer 12 (with its roughened surface 120) effectively "sends back" more photons in the direction of the light emission face 100 than it "lets through" in the opposite direction, the net result of using several such high-index layers 12 is that little or no photons make it to the lowermost face 101 of the mirror 1. Therefore, there is no need to apply a reflective backing to this rear face 101. There are advantages associated with not requiring a reflective backing, namely a saving in cost as well as temperature independence. As explained in the introduction, a satisfactorily reflective metal backing is costly, and also sensitive to high temperatures.

Figure 4:
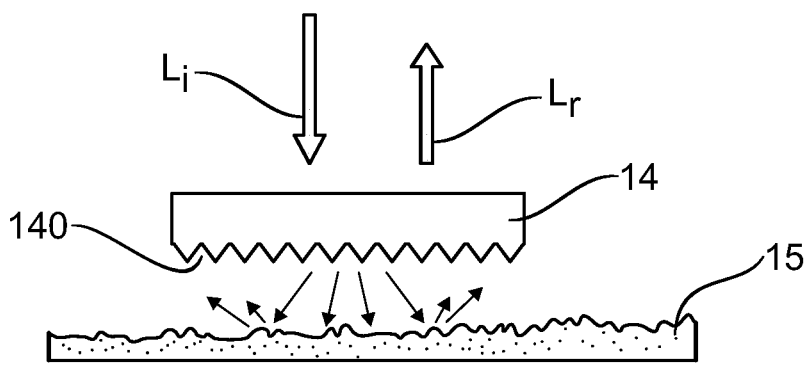
FIG. 4 shows a patterned dielectric arrangement.
Figure 5:
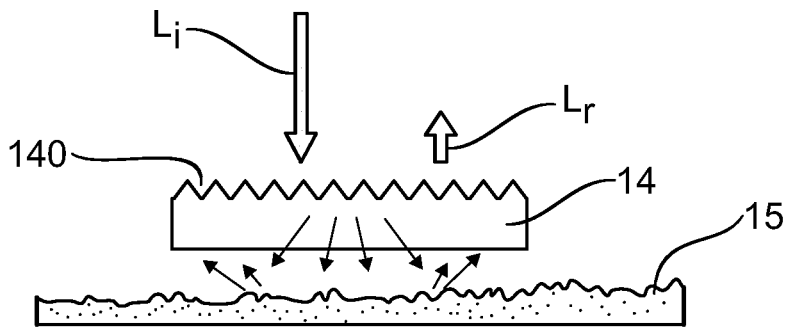
FIG. 5 shows a patterned dielectric arrangement.
Figure 6:
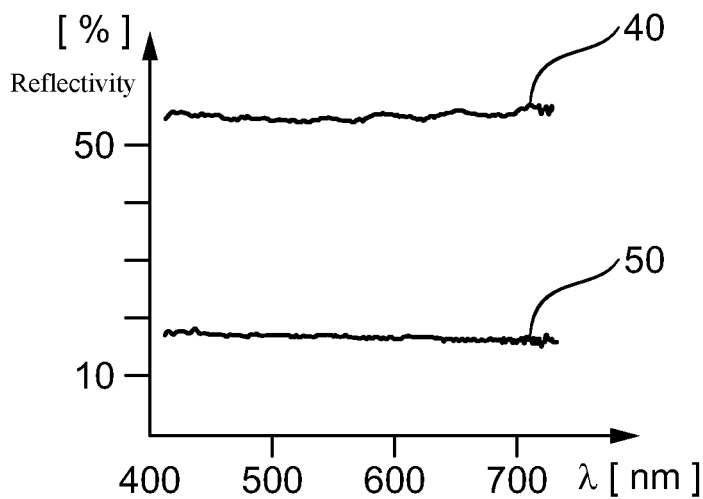
FIG. 6 shows graphs of reflectivity for the patterned dielectric arrangements of FIG. 4 and FIG. 5.

FIGS. 4-6 illustrate the principle of the invention. When a sapphire wafer is patterned on one side, an increase in total reflectance can be observed. In experiments relating to the invention, a patterned sapphire wafer 14 is arranged over an absorber layer 15 comprising a material that has a near-zero reflectivity in the visible light range. A suitable material can be a flocked matte black paper layer. The sapphire substrate has a high refractive index, while air has a low refractive index. The known laws of refraction apply at the air/wafer boundaries (on each side of the wafer). The patterned surface 140 will act to scatter photons within the wafer on account of the high-index/low-index interface and the pattern geometry. By scattering the photons, the incidences of total internal reflection within the wafer are increased. To measure the reflectivity of the patterned wafer 14, incident light $L_i$ is directed through the wafer 14 and the quantity of reflected light $L_r$ is measured. The experiment is performed for an arrangement with the patterned surface 140 facing towards the absorber 15 in FIG. 4, and for an arrangement with the patterned surface 140 facing away from the absorber 15 in FIG. 5. The observed results are shown in FIG. 6, which shows a first reflectivity graph 40 for the arrangement of FIG. 4, and a second reflectivity graph 50 for the arrangement of FIG. 5. The observations were made over a wavelength range from 400 nm to 750 nm (X-axis). With the patterned surface 140 facing towards the absorber 15, the patterned sapphire substrate 14 exhibits a reflectivity exceeding 50% over the entire wavelength range, i.e. about half the light is reflected back through the wafer 14, regardless of wavelength. With the patterned surface 140 facing outward from the absorber 14, the patterned sapphire substrate 14 exhibits a reflectivity of about 15%, i.e. about 85% of the light passes through the wafer 14. In each case, the wafer 14 acts to prevent the reflected percentage of the photons from reaching the back absorber.

The observed results are transferable to the inventive dielectric mirror, since the refractive index of silicon nitride is higher than that of sapphire, while the refractive index of silicon dioxide is higher than air but lower than silicon nitride and sapphire. The observed effect is used to advantage in the inventive broadband mirror described in FIG. 1 above: with the patterned surface of a high-index layer 12 facing the reflective backing 13, about 50% or half of the light will be reflected back towards the light emission face 100. The other half passes through the high-index layer 12 to reach the reflective backing 13, undergoes reflection, and most of this light, i.e. about 85%, will pass through the high-index layer 12 and reach the light emission face 100. The high-index layer 12, in conjunction with a patterned surface at a high-index/low-index boundary, significantly increases the net reflectance (package reflectivity) of the broadband mirror 1. The observed effect is independent of wavelength, and can therefore be used in a wide range of applications, for example to improve the light output of an LED of any colour.

FIG. 7 shows various graphs of normalized radiation intensity (Y-axis) against angle of incidence θ (X-axis,). A reference graph R indicates the angular distribution of the incident radiation. Two further graphs $P_8$, $P_9$ illustrate the performance of prior art dielectric mirrors 8, 9 as shown in FIGS. 8 and 9 respectively. The prior art dielectric mirror 8 comprises a GaN layer 10 backed with a reflective backing 13, and its graph $P_8$ shows a consistent difference to the reference curve R over the entire angular range. The prior art dielectric mirror 9 of FIG. 9 comprises a low-index $SiO_2$ layer 91 between the GaN layer 10 and the reflective backing 13, and its graph $P_9$ shows an increase in reflectivity beyond the critical angle (angle of total internal reflection) determined by the different refractive indices of GaN and $SiO_2$. Beyond that angle, its reflectivity curve $P_9$ essentially coincides with curve R. Curve $P_1$ is the reflectivity of the inventive broadband mirror as shown in FIG. 1, while curve $P_2$ is the reflectivity of the inventive broadband mirror for the embodiment of FIG. 2. These curves $P_1$, $P_2$ illustrate a significant improvement in the region around 45°, i.e. the region of greatest incident radiation. The embodiments of FIG. 1 and FIG. 2 are therefore about 11.5% more reflective over the entre visible spectrum that the prior art mirror of FIG. 8, and 2% more reflective than the prior art mirror of FIG. 9.

Although the present invention has been disclosed in the form of preferred embodiments and variations thereon, it will be understood that numerous additional modifications and variations could be made thereto without departing from the scope of the invention. For example, instead of using the inventive broadband mirror as a "bottom mirror", it could be realised as a side mirror. An example of such an application might be to coat the sapphire walls of a chip-scale-package die.

For the sake of clarity, it is to be understood that the use of "a" or "an" throughout this application does not exclude a plurality, and "comprising" does not exclude other steps or elements.

REFERENCE SIGNS broadband reflector 1
outer layer 10,
light emission surface 100
rear surface 101
low-index layer 11A, 11B
patterned surface 110
high-index layer 12
patterned surface 120
reflector 13
patterned sapphire substrate 14
patterned surface 140
absorber 15
reflectivity graph 40, 50
prior art reflector 8, 9
emitted light L
incident light $L_i$
reflected light $L_r$
radiation intensity R
radiation intensity $P_8$, $P_9$
radiation intensity $P_1$, $P_2$

The invention claimed is:

1. A broadband mirror comprising
    a single outer surface layer;
    a dielectric layer stack arranged adjacent to the single outer surface layer and comprising an alternating arrangement of low-index layers and high-index layers, the dielectric layer stack comprising:
    at least one patterned surface formed on one side of a high-index layer at an interface between the high-index layer and a first adjacent low-index layer; and
    at least one non-patterned surface formed on the other side of the high-index layer at the interface between the high-index layer and a second adjacent low-index layer, the other side of the high-index layer configured closer to the single outer surface layer than the one side of the high-index layer; and
    a reflective backing layer formed adjacent to the dielectric stack distal to the single outer surface layer.

2. The broadband mirror according to claim 1, wherein the dielectric layer stack is terminated by the reflective backing.

3. The broadband mirror according to claim 1, wherein the high-index layer is arranged between the first adjacent low-index layer and the second adjacent low-index layer.

4. The broadband mirror according to claim 1, wherein the patterned surface comprises a pattern with a feature size in the range of 100 nm to 2.0 µm.

5. The broadband mirror according to claim 1, wherein the alternating arrangement of low-index layers and high-index layers includes the low-index layers and the high-index layers each having a thickness in the range of 500 nm to 2.0 µm.

6. The broadband mirror according to claim 1, wherein the alternating arrangement of low-index layers and high-index layers comprises at most 15 layers.

7. The broadband mirror according to claim 1, wherein the dielectric layer stack comprises at least two patterned surfaces.

8. The broadband mirror according to claim 1, wherein the single outer surface layer comprises a high-index layer.

9. A light-emitting diode comprising a broadband mirror according to claim 1.

10. The broadband mirror according to claim 1, wherein the alternating arrangement of low-index layers and high-index layers comprises at most 9 layers.

11. The broadband mirror according to claim 1, wherein the alternating arrangement of low-index layers and high-index layers comprises at most 3 layers.

12. The broadband mirror according to claim 1, wherein the reflective backing layer directs any incident photons back toward the single outer surface layer.

13. A method of manufacturing a broadband mirror, the method comprising:
    providing a single outer surface layer;
    applying an alternating arrangement of low-index layers and high index layers to build a dielectric layer stack adjacent to the single outer surface layer;
    forming at least one patterned surface on one side of a high-index layer at an interface between the high-index layer and a first adjacent low-index layer;
    forming at least one non-patterned surface on the other side of the high-index layer at the interface between the high-index layer and a second adjacent low-index layer; and
    forming a reflective backing layer adjacent to the dielectric layer stack distal to the single outer surface layer.

14. The method according to claim 13, wherein the step of patterning a layer surface comprises any of a photo-electrochemical (PEC) etching step, a micromachining step, a photolithography step, a nanoimprint lithography step.

15. The method according to claim 13, wherein the patterning step comprises forming a regular surface structure to achieve total internal reflection at a boundary between the patterned layer and the subsequent layer.

16. The method according to claim 13, wherein the dielectric layer stack is built by alternatively applying silicon dioxide layers and silicon nitride layers.

* * * * *